United States Patent
Liu

(10) Patent No.: US 9,235,662 B2
(45) Date of Patent: Jan. 12, 2016

(54) LITHOGRAPHY MODEL FOR 3D RESIST PROFILE SIMULATIONS

(71) Applicant: Peng Liu, Sunnyvale, CA (US)

(72) Inventor: Peng Liu, Sunnyvale, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 391 days.

(21) Appl. No.: 13/757,472

(22) Filed: Feb. 1, 2013

(65) Prior Publication Data
US 2013/0204594 A1    Aug. 8, 2013

Related U.S. Application Data

(60) Provisional application No. 61/594,820, filed on Feb. 3, 2012.

(51) Int. Cl.
   *G06F 17/50* (2006.01)
   *G03F 7/20* (2006.01)

(52) U.S. Cl.
   CPC ............ *G06F 17/5009* (2013.01); *G03F 7/705* (2013.01); *G03F 7/70625* (2013.01); *G03F 7/70666* (2013.01)

(58) Field of Classification Search
   CPC ........ G03B 17/24; G03B 27/42; G03B 27/32; G03F 7/705; G03F 7/70625; G03F 7/70666
   USPC .......................................... 703/13; 355/53, 30
   See application file for complete search history.

(56) References Cited

U.S. PATENT DOCUMENTS

| | | | |
|---|---|---|---|
| 7,003,758 B2 | 2/2006 | Ye et al. | |
| 7,587,704 B2 | 9/2009 | Ye et al. | |
| 7,703,069 B1 | 4/2010 | Liu et al. | |
| 7,948,606 B2 | 5/2011 | Visser et al. | |
| 2005/0254024 A1* | 11/2005 | Van Greevenbroek et al. . | 355/30 |
| 2007/0242253 A1 | 10/2007 | Visser et al. | |
| 2007/0296938 A1* | 12/2007 | Tel et al. .......................... | 355/53 |
| 2009/0261491 A1 | 10/2009 | Hideki | |

(Continued)

FOREIGN PATENT DOCUMENTS

| | | |
|---|---|---|
| CN | 1675516 | 9/2005 |
| CN | 101055429 | 10/2007 |
| CN | 101587596 | 11/2009 |

(Continued)

OTHER PUBLICATIONS

Yu Cao et al., "Optimized Hardware and Software for Fast, Full Chip Simulation," Proc. of SPIE, vol. 5754, pp. 407-414 (2005).

(Continued)

*Primary Examiner* — Kandasamy Thangavelu
(74) *Attorney, Agent, or Firm* — Pillsbury Winthrop Shaw Pittman LLP

(57) ABSTRACT

Described herein is a method for simulating a three-dimensional spatial intensity distribution of radiation formed within a resist layer on a substrate resulting from an incident radiation, the method comprising: calculating an incoherent sum of forward propagating radiation in the resist layer and backward propagating radiation in the resist layer; calculating an interference of the forward propagating radiation in the resist layer and the backward propagating radiation in the resist layer; and calculating the three-dimensional spatial intensity distribution of radiation from the incoherent sum and the interference.

21 Claims, 9 Drawing Sheets

(56) References Cited

U.S. PATENT DOCUMENTS

2011/0224963 A1  9/2011  Isoyan et al.
2012/0179282 A1  7/2012  Sarma et al.

FOREIGN PATENT DOCUMENTS

| JP | H06-342746 | 12/1994 |
| JP | 2000-241984 | 9/2000 |
| JP | 3-298187 | 7/2002 |
| JP | 2005-536074 | 11/2005 |
| TW | I303090 | 11/2008 |

OTHER PUBLICATIONS

Chandra Sarma et al., "3D physical modeling for patterning process development," Proc. of SPIE, vol. 7641, pp. 76410B-1-76410B-9 (2010).

Jeffrey Byers et al., "3D Lumped Parameter Model for Lithographic Simulations," Proc. of SPIE, vol. 4691, pp. 125-137 (2002).

\* cited by examiner z

LITHOGRAPHY MODEL FOR 3D RESIST PROFILE SIMULATIONS

CROSS-REFERENCE TO RELATED APPLICATIONS

This application claims priority to U.S. Provisional Application No. 61/594,820 filed Feb. 3, 2012, which is incorporated herein by reference in its entirety.

FIELD OF INVENTION

This invention relates generally to lithography processes and relates more particularly to a method for modeling a three-dimensional spatial intensity distribution of radiation formed within a resist layer and a three-dimensional resist image.

BACKGROUND

Lithographic apparatuses can be used, for example, in the manufacture of integrated circuits (ICs). In such a case, the mask may contain a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step and scan apparatus, each target portion is irradiated by progressively scanning the mask pattern under the projection beam in a given reference direction (the "scanning" direction) while synchronously scanning the substrate table parallel or anti parallel to this direction. Since, in general, the projection system will have a magnification factor M (generally <1), the speed V at which the substrate table is scanned will be a factor M times that at which the mask table is scanned.

In a manufacturing process using a lithographic projection apparatus, a mask pattern is imaged onto a substrate that is at least partially covered by a layer of radiation sensitive material (resist). Prior to this imaging step, the substrate may undergo various procedures, such as priming, resist coating and a soft bake. After exposure, the substrate may be subjected to other procedures, such as a post exposure bake (PEB), development, a hard bake and measurement/inspection of the imaged features. This array of procedures is used as a basis to pattern an individual layer of a device, e.g., an IC. Such a patterned layer may then undergo various processes such as etching, ion implantation (doping), metallization, oxidation, chemo mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the wafer (via the mask).

As noted, microlithography is a central step in the manufacturing of semiconductor integrated circuits, where patterns formed on semiconductor wafer substrates define the functional elements of semiconductor devices, such as microprocessors, memory chips etc. Similar lithographic techniques are also used in the formation of flat panel displays, micro-electro mechanical systems (MEMS) and other devices.

As semiconductor manufacturing processes continue to advance, the dimensions of circuit elements have continually been reduced while the amount of functional elements, such as transistors, per device has been steadily increasing over decades, following a trend commonly referred to as "Moore's law." At the current state of technology, critical layers of leading-edge devices are manufactured using optical lithographic projection systems known as scanners that project a mask image onto a substrate using illumination from a deep-ultraviolet laser light source, creating individual circuit features having dimensions well below 100 nm, i.e. less than half the wavelength of the projection light.

This process in which features with dimensions smaller than the classical resolution limit of an optical projection system are printed, is commonly known as low-k1 lithography, according to the resolution formula $CD=k_1 \times \lambda/NA$, where $\lambda$ is the wavelength of radiation employed (currently in most cases 248 nm or 193nm), NA is the numerical aperture of the projection optics, CD is the "critical dimension"—generally the smallest feature size printed—and k1 is an empirical resolution factor. In general, the smaller k1, the more difficult it becomes to reproduce a pattern on the wafer that resembles the shape and dimensions planned by a circuit designer in order to achieve particular electrical functionality and performance. To overcome these difficulties, sophisticated fine-tuning steps are applied to the projection system as well as to the mask design. These include, for example, but not limited to, optimization of NA and optical coherence settings, customized illumination schemes, use of phase shifting masks, optical proximity correction in the mask layout, or other methods generally defined as "resolution enhancement techniques" (RET).

As one important example of RET, optical proximity correction (OPC), addresses the fact that the final size and placement of a printed feature on the wafer will not simply be a function of the size and placement of the corresponding feature on the mask. It is noted that the terms "mask" and "reticle" are utilized interchangeably herein. For the small feature sizes and high feature densities present on typical circuit designs, the position of a particular edge of a given feature will be influenced to a certain extent by the presence or absence of other adjacent features. These proximity effects arise from minute amounts of light coupled from one feature to another. Similarly, proximity effects may arise from diffusion and other chemical effects during post-exposure bake (PEB), resist development, and etching that generally follow lithographic exposure.

In order to ensure that the features are generated on a semiconductor substrate in accordance with the requirements of the given target circuit design, proximity effects need to be predicted utilizing sophisticated numerical models, and corrections or pre-distortions need to be applied to the design of the mask before successful manufacturing of high-end devices becomes possible. In a typical high-end design almost every feature edge requires some modification in order to achieve printed patterns that come sufficiently close to the target design. These modifications may include shifting or biasing of edge positions or line widths as well as application of "assist" features that are not intended to print themselves, but will affect the properties of an associated primary feature. In the semiconductor industry, microlithography (or simply lithography) is the process of printing circuit patterns on a semiconductor wafer (for example, a silicon or GaAs wafer). Currently, optical lithography is the predominant technology used in volume manufacturing of semiconductor devices and other devices such as flat-panel displays. Such lithography employs light in the visible to the deep ultraviolet spectral range to expose photosensitive resist on a substrate. In the future, extreme ultraviolet (EUV) and soft x-rays may be employed. Following exposure, the resist is developed to yield a resist image.

Prior to discussing the present invention, a brief discussion regarding the overall simulation and imaging process is provided. FIG. 1 illustrates an exemplary lithographic projection system 10. The major components are a light source 12, which may be, for example, a deep-ultraviolet excimer laser source, or a source of other wavelengths, including EUV wavelength, illumination optics, which define the partial coherence, and which may include specific source shaping optics 14, 16a and 16b; a mask or reticle 18; and projection optics 16c that produce an image of the reticle pattern onto the wafer plane 22. An adjustable filter or aperture 20 at the pupil plane may restrict the range of beam angles that impinge on the wafer plane 22, where the largest possible angle defines the numerical aperture of the projection optics $NA=\sin(\theta_{max})$.

An exemplary flow chart for simulating lithography in a lithographic projection apparatus is illustrated in FIG. 2. A source model 31 represents optical characteristics (including radiation intensity distribution and/or phase distribution) of the source. A projection optics model 32 represents optical characteristics (including changes to the radiation intensity distribution and/or the phase distribution caused by the projection optics) of the projection optics. A design layout model 35 represents optical characteristics (including changes to the radiation intensity distribution and/or the phase distribution caused by a given design layout 33) of a design layout, which is the representation of an arrangement of features on or formed by a patterning device. An aerial image 36 can be simulated from the design layout model 35, the projection optics model 32 and the design layout model 35. A resist image 37 can be simulated from the aerial image 36 using a resist model 37. Simulation of lithography can, for example, predict contours and CDs in the resist image.

More specifically, it is noted that the source model 31 can represent the optical characteristics of the source that include, but not limited to, NA-sigma ($\sigma$) settings as well as any particular illumination source shape (e.g. off-axis radiation sources such as annular, quadrupole, and dipole, etc.). The projection optics model 32 can represent the optical characteristics of the of the projection optics that include aberration, distortion, refractive indexes, physical sizes, physical dimensions, etc. The design layout model 35 can also represent physical properties of a physical patterning device, as described, for example, in U.S. Pat. No. 7,587,704, which is incorporated by reference in its entirety. The objective of the simulation is to accurately predict, for example, edge placements, aerial image intensity slopes and CDs, which can then be compared against an intended design. The intended design is generally defined as a pre-OPC design layout which can be provided in a standardized digital file format such as GDSII or OASIS or other file format.

When the resist is exposed by the projected image and thereafter baked and developed, the resist tends to undergo complex chemical and physical changes. The final resist patterns are typically characterized by their critical dimensions, or CD, usually defined as the width of a resist feature at the resist-substrate interface. While the CD is usually intended to represent the smallest feature being patterned in the given device, in practice the term CD is used to describe the linewidth of any resist feature.

In most exposure tools, the optical system reduces the size of the pattern from the mask level to the wafer level by a reduction factor, typically 4 or 5. Because of this the pattern at the mask level is typically larger than the desired pattern at the wafer level, which relaxes the dimensional control tolerances required at the mask level and improves the yield and manufacturability of the mask-making process. This reduction factor of the exposure tool introduces certain confusion in referring to "the dimension" of the exposure process. Herein, features sizes and dimensions refer to wafer-level feature sizes and dimensions, and the "minimum feature size" refers to a minimum feature at the wafer level.

For an exposure process to pattern a device correctly, the CDs of all critical structures in the device must be patterned to achieve the design target dimensions. Since it is practically impossible to achieve every target CD with no errors, the device is designed with a certain tolerance for CD errors. In this case, the pattern is considered to be acceptable if the CDs of all critical features are within these predefined tolerances. For the exposure process to be viable in a manufacturing environment, the full CD distribution must fall within the tolerance limits across a range of process conditions that represents the typical range of process variations expected to occur in the fab. For example, the actual doses of nominally identical process conditions can vary up to ±5% from the nominal dose; the actual focal planes of nominally identical process conditions can vary up to ±100 nm from the nominal focal plane.

Factors that limit or degrade the fidelity of the pattern transfer process include imperfections in the mask-making process, in the projection optics, in the resist process, and in the control of the interaction between the projected light and the film stacks formed on the wafer. However, even with a perfect mask, perfect optics, a perfect resist system, and perfect substrate reflectivity control, image fidelity becomes difficult to maintain as the dimensions of the features being imaged become smaller than the wavelength of light used in the exposure tool. For exposure processes using 193 nm illumination sources, features as small as 65 nm are desired. In this deep sub-wavelength regime, the pattern transfer process becomes highly non-linear, and the dimensions of the final pattern at the wafer level become a very sensitive function not only of the size of the pattern at the mask level, but also of the local environment of the feature, where the local environment extends out to a radius of roughly five to ten times the wavelength of light. Given the very small feature sizes compared to the wavelength, even identical structures on the mask will have different wafer-level dimensions depending on the sizes and proximities of neighboring features, and even features that are not immediately adjacent but still within the proximity region defined by the optics of the exposure tool. These optical proximity effects are well known in the literature.

In an effort to improve imaging quality and minimize high non-linearity in the pattern transfer process, current processing techniques employ various RET and OPC, a general term for any technology aimed at overcoming proximity effects. One of the simplest forms of OPC is selective bias. Given a CD vs. pitch curve, all of the different pitches could be forced to produce the same CD, at least at best focus and exposure, by changing the CD at the mask level. Thus, if a feature prints too small at the wafer level, the mask level feature would be biased to be slightly larger than nominal, and vice versa. Since the pattern transfer process from mask level to wafer level is non-linear, the amount of bias is not simply the measured CD error at best focus and exposure times the reduction ratio, but with modeling and experimentation an appropriate bias can be determined. Selective bias is an incomplete solution to the problem of proximity effects, particularly if it is only applied at the nominal process condition. Even though such bias could, in principle, be applied to give uniform CD vs. pitch curves at best focus and exposure, once the exposure process varies from the nominal condition, each biased pitch curve will respond differently, resulting in different process windows for the different features. Therefore, the "best" bias to give identical CD vs. pitch may even have a negative impact on the overall process window, reducing rather than enlarging the focus and exposure range within which all of the target features print on the wafer within the desired process tolerance.

Other more complex OPC techniques have been developed for application beyond the one-dimensional bias example above. A two-dimensional proximity effect is line end shortening. Line ends have a tendency to "pull back" from their desired end point location as a function of exposure and focus. In many cases, the degree of end shortening of a long line end can be several times larger than the corresponding line narrowing. This type of line end pull back can result in catastrophic failure of the devices being manufactured if the line end fails to completely cross over the underlying layer it was intended to cover, such as a polysilicon gate layer over a source-drain region. Since this type of pattern is highly sensitive to focus and exposure, simply biasing the line end to be longer than the design length is inadequate because the line at best focus and exposure, or in an underexposed condition, would be excessively long, resulting either in short circuits as the extended line end touches neighboring structures, or unnecessarily large circuit sizes if more space is added between individual features in the circuit. Since one of the key goals of integrated circuit design and manufacturing is to maximize the number of functional elements while minimizing the area required per chip, adding excess spacing is a highly undesirable solution.

Two-dimensional OPC approaches have been developed to help solve the line end pull back problem. Extra structures (or assist features) known as "hammerheads" or "serifs" are routinely added to line ends to effectively anchor them in place and provide reduced pull back over the entire process window. Even at best focus and exposure these extra structures are not resolved but they alter the appearance of the main feature without being fully resolved on their own. A "main feature" as used herein means a feature intended to print on a wafer under some or all conditions in the process window. Assist features can take on much more aggressive forms than simple hammerheads added to line ends, to the extent the pattern on the mask is no longer simply the desired wafer pattern upsized by the reduction ratio. Assist features such as serifs can be applied to many more cases than simply reducing line end pull back Inner or outer serifs can be applied to any edge, especially two dimensional edges, to reduce corner rounding or edge extrusions. With enough selective biasing and assist features of all sizes and polarities, the features on the mask bear less and less of a resemblance to the final pattern desired at the wafer level. In general, the mask pattern becomes a pre-distorted version of the wafer-level pattern, where the distortion is intended to counteract or reverse the pattern deformation that will occur during the lithographic process to produce a pattern on the wafer that is as close to the one intended by the designer as possible.

Many of these OPC techniques can be used together on a single mask with phase-shifting structures of different phases added in as well for both resolution and process window enhancement. The simple task of biasing a one-dimensional line becomes increasingly complicated as two-dimensional structures must be moved, resized, enhanced with assist features, and possibly phase-shifted without causing any conflict with adjoining features. Due to the extended proximity range of deep sub-wavelength lithography, changes in the type of OPC applied to a feature can have unintended consequences for another feature located within half a micron to a micron. Since there are likely to be many features within this proximity range, the task of optimizing OPC decoration becomes increasingly complex with the addition of more aggressive approaches. Each new feature that is added has an effect on other features, which then can be re-corrected in turn, and the results can be iterated repeatedly to converge to a mask layout where each feature can be printed in the manner in which it was originally intended while at the same time contributing in the proper manner to the aerial images of its neighboring features such that they too are printed within their respective tolerances.

SUMMARY

Described herein is a method for simulating a three-dimensional spatial intensity distribution of radiation formed within a resist layer on a substrate resulting from an incident radiation, the method comprising: calculating an incoherent sum of forward propagating radiation in the resist layer and backward propagating radiation in the resist layer; calculating an interference of the forward propagating radiation in the resist layer and the backward propagating radiation in the resist layer; and calculating the three-dimensional spatial intensity distribution of radiation from the incoherent sum and the interference.

BRIEF DESCRIPTION OF THE DRAWINGS

The specific embodiments are described in conjunction with the accompanying figures, wherein.

DETAILED DESCRIPTION

Embodiments will now be described in detail with reference to the drawings, which are provided as illustrative examples. Notably, the figures and examples below are not meant to limit the scope to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted without obscuration. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration. The present inventors recognize that the pattern transfer process from the mask to the substrate during a lithographic process is further complicated by scattering or reflection of incident radiation from the projection optics by the substrate under a resist layer or by existing features on the substrate, especially when the substrate lacks an anti-reflective coating (BARC). The words "radiation" and "light" may be used interchangeably. Light may be visible light or invisible light, such as UV, EUV, and X-ray.

Figure 1:
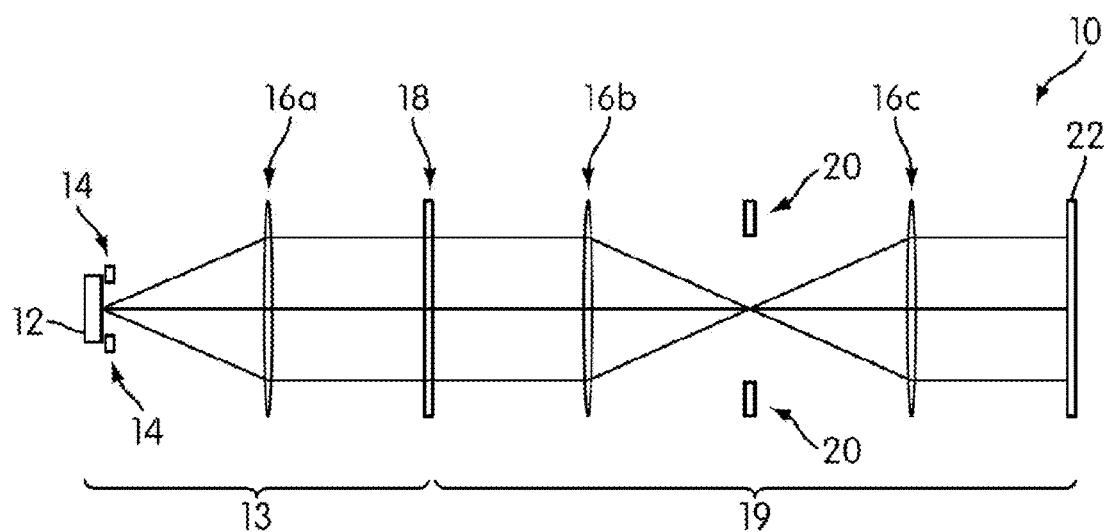
FIG. 1 is a block diagram of various subsystems of a lithography system according to example implementations of the present invention.
Figure 2:
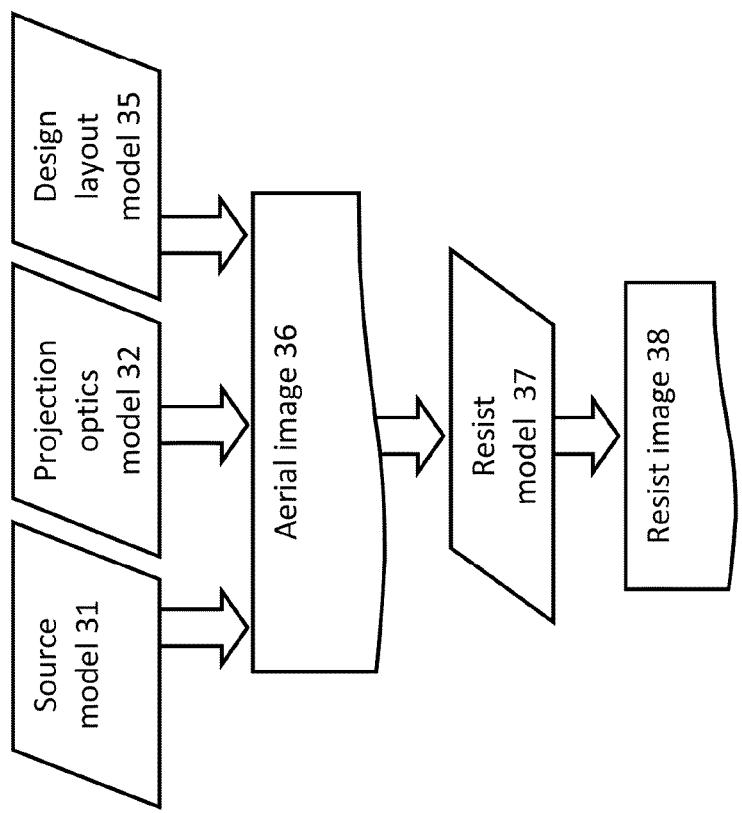
FIG. 2 is a block diagram of simulation models corresponding to the subsystems in FIG. 1.
Figure 3:
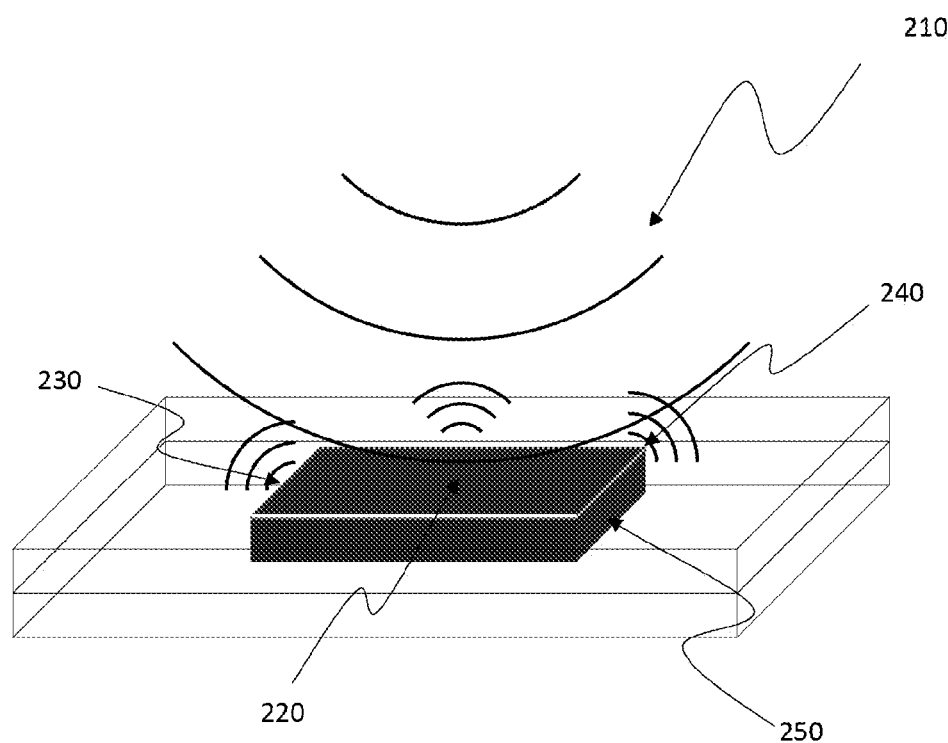
FIG. 3 illustrates scattering of incident radiation from features on a substrate.

As illustrated in FIG. 3, existing features 250 (or the substrate itself) can scatter incident radiation 210 from surfaces 220, edges 230 and corners 240. The term "scatter" or "scattering" as used herein means a combination of effects to incident radiation, which can include reflection, diffraction, and refraction. Scattered radiation can interfere with incident radiation and change three-dimensional spatial intensity distribution of radiation in the resist layer, which in turn changes a three-dimensional resist image formed therein. A sufficiently accurate three-dimensional resist image can help detection of patterning defects that traditional two-dimensional resist image cannot detect. This scattering can cause distortion to the resultant three-dimensional resist image, especially when the scattered radiation and the incident radiation form a standing wave across the depth of the resist layer. Therefore, this scattering should also be compensated for in OPC. The effect of this scattering can be rigorously predicted by solving Maxwell's equations, which however is computationally costly and impractical to apply to a full substrate or a full mask. Conventional approximation approaches assume that three-dimensional spatial intensity distribution of radiation has a weak dependence on the depth into the resist layer and thus fail when a standing wave exists in the resist layer. Complete absence of standing wave in the resist layer rarely happens.

Figure 4:
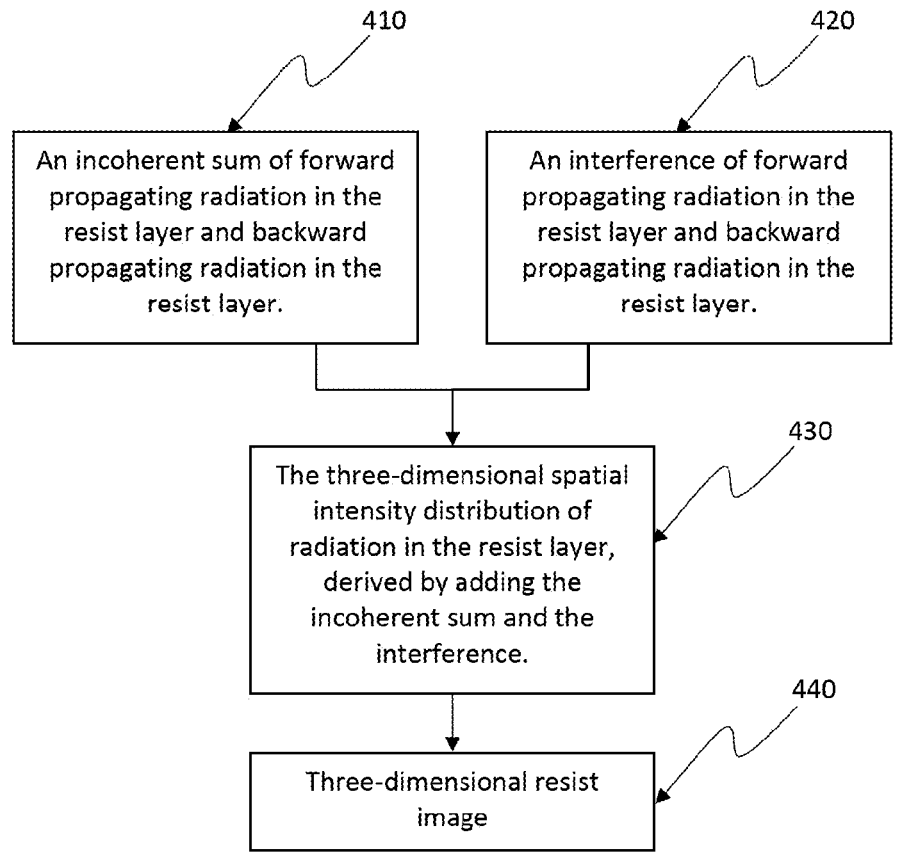
FIG. 4 shows a flow chart of a method according to an embodiment.
Figure 5:
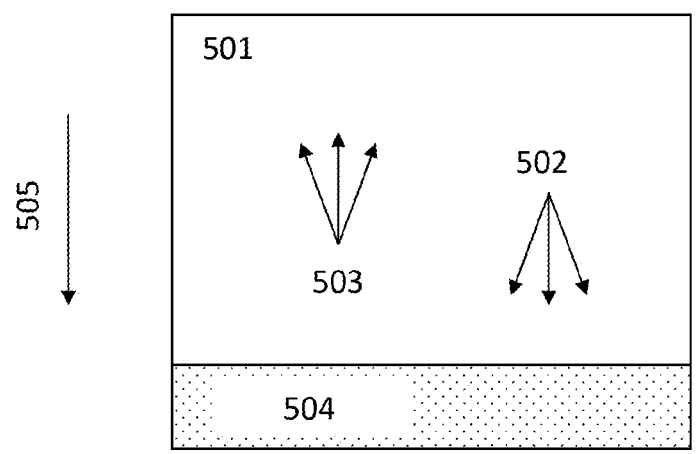
FIG. 5 shows schematic of forward propagating radiation and backward propagating radiation in the resist layer.

In some embodiments, the three-dimensional spatial intensity distribution of radiation in the resist layer can be derived using an example method depicted in the flow chart of FIG. 4. This method is much less computationally costly and can be applied to a substantially full circuit design or the full mask. An incoherent sum 410 of forward propagating radiation in the resist layer and backward propagating radiation in the resist layer can be calculated. The incoherent sum 410 is preferably free of standing wave. An interference 420 of forward propagating radiation in the resist layer and backward propagating radiation in the resist layer can be calculated. For the purpose to deriving the three-dimensional spatial intensity distribution of radiation, the forward propagating radiation 502 can be represented by forward propagating electric field or forward propagating magnetic field; the backward propagating radiation 503 can be represented by backward propagating electric field or backward propagating magnetic field. The phrase "forward propagating" and "backward propagating" mean the radiation propagating towards the substrate underlying the resist layer and the radiation propagating away from the substrate 504 underlying the resist layer 501, respectively (FIG. 5). Arrow 505 is the depth direction.

A sum 430 can be calculated by adding the incoherent sum 410 and the interference 420, as an approximation of the three-dimensional spatial intensity distribution of radiation in the resist layer. Alternatively, the sum 430 can be calculated without explicitly calculating the incoherent sum 410 and the interference 420.

Optionally, from the sum 430, a three-dimensional resist image 440 can be derived from the sum 430, characteristics of the resist layer and post-exposure processing such as parameters related to developing, baking, etc.

In one example, the sum 430, the incoherent sum 410 and the interference 420 can be calculated using a transmission cross coefficient (TCC). A TCC is defined as $$TCC(k',k'',z) = \Sigma_k A(k)^2 L(k+k',z) L^*(k+k'',z) \quad \text{(Eq. 1)}.$$

The three-dimensional spatial intensity distribution of radiation in the resist layer can be expressed as $$\sum_k \left| A(k) \sum_{k'} M(k'-k) L(k',z) \exp(-jk'r) \right|^2 = \sum_k A(k)^2 \left[ \sum_{k'} \sum_{k''} M(k'-k) L(k',z) \right] \quad \text{(Eq. 2)}$$

-continued
$$M^*(k''-k)L^*(k'',z)\exp(-j(k'-k'')r)\Big] =$$

$$\sum_{k'}\sum_{k''}\Big[\sum_k A(k)^2 L(k+k',z)L^*(k+k'',z)\Big]$$ (5)

$$M(k')M^*(k'')\exp(-j(k'-k'')r) =$$

$$\sum_{k'}\sum_{k''} TCC(k',k'',z)M(k')M^*(k'')\exp(-j(k'-k'')r).$$

A(k) is the source amplitude from point k on the source pupil plane. L(k) is the projection optics function for point k on the lens pupil plane. The projection optics function represents distortions caused by the projection optics to the radiation passing through the projection optics (e.g., distortions in amplitude, phase or both) as a function of location. The projection optics function can also be generalized to include distortions caused by the filmstack including the resist layer, and thus depends on z (depth into the resist layer). The projection optics function may also include optical effects including source polarization, NA filtering, defocus, aberration, etc. M(k) is the mask function (i.e., design layout function) in the spatial frequency domain, and can be obtained from the mask function in the space domain by a Fourier transform. The mask function in the space domain represents distortions caused by the mask to the light passing through the mask (e.g., distortions in amplitude, phase or both) as a function of location. More details can be found in, for example, in U.S. Pat. No. 7,587,704, which is incorporated by reference in its entirety. A function in the space domain can be transformed to a corresponding function in the spatial frequency domain and vice versa by Fourier transform. Here, r and k are both vectors. r is a vector in the spatial domain, r=(x, y, z).

Specifically, L(k+k',z) may be split into two terms $$L(k+k',z)=L_+(k+k',z)e^{i\beta z}+L_-(k+k',z)e^{-i\beta z}$$ (Eq. 3), wherein the first term $L_+(k+k',z)e^{i\beta z}$ represents distortions caused by the projection optics and the filmstack to the forward propagating radiation and the second term $L_-(k+k',z)e^{-i\beta z}$ represents distortions caused by the projection optics and the filmstack to the backward propagating radiation. $e^{\pm i\beta z}$ includes the main portion of the z dependency, namely the phase dependency of a planer wave. The remaining z dependency is included in $$L_\pm(k+k',z)=L_\pm(k+k')e^{\pm i\Delta\beta z}$$ (Eq. 4);

wherein $\Delta\beta=\sqrt{(2\pi\tilde{n}/\lambda)^2-|k+k'|^2}-2\pi n/\lambda$ (Eq. 5).

$\tilde{n}$ is the refractive index including a real part n and an imaginary part. The summation over k in Eq. 2 is limited to $$|k+k'|<NA\frac{2\pi}{\lambda} \text{ and } |k+k''|<NA\frac{2\pi}{\lambda}$$

due to NA filtering.

By plugging Eq. 3 into Eq. 1, the TCC can be written as $$TCC(k',k'',z)=TCC_a(k',k'',z)[1+b(k',k'',z)]$$ (Eq. 6)

wherein $TCC_a(k',k'',z)=TCC_{++}(k',k'',z)+TCC_{--}(k',k'',z)$ $$b(k',k'',z)=$$

-continued
$$\frac{TCC_{+-}(k',k'',z)\cos(2\beta z)+TCC_{-+}(k',k'',z)\sin(2\beta z)}{TCC_{++}(k',k'',z)+TCC_{--}(k',k'',z)}$$

$$TCC_{++}(k',k'',z)=\sum_k A(k)^2 L_+(k+k',z)L_+^*(k+k'',z)$$

$$TCC_{--}(k',k'',z)=\sum_k A(k)^2 L_-(k+k',z)L_-^*(k+k'',z)$$

$$TCC_{+-}(k',k'',z)=\sum_k A(k)^2$$

$$[L_+(k+k',z)L_-^*(k+k'',z)+L_-(k+k',z)L_+^*(k+k'',z)]$$

$$TCC_{-+}(k',k'',z)=\sum_k A(k)^2[L_+(k+k',z)L_-^*(k+k'',z)-$$

$$L_-(k+k',z)L_+^*(k+k'',z)].$$

$TCC_a(k', k'', z)$ represents the incoherent sum; b(k', k'', z) is an interference factor; and $TCC_a(k', k'', z)b(k', k'', z)$ represents the interference. If Eq. 6 is plugged into Eq. 2, the three-dimensional spatial intensity distribution of radiation in the resist layer manifests as a sum of the incoherent sum 410 $\Sigma_k\Sigma_{k''}TCC_a(k', k'', z)M(k')M^*(k'')\exp(-j(k'-k'')r)$, and the interference 420 $\Sigma_k\Sigma_{k''}TCC_a(k', k'', z)b(k', k'', z)M(k')M^*(k'')\exp(-j(k'-k'')r)$.

$TCC_a(k', k'', z)$ and b(k', k'', z) can be approximated. For example, $TCC_a(k', k'', z)$ can be expanded into a Taylor series, e.g., to the quadratic term of z, $$TCC_a(k',k'',z)\approx TCC_0(k',k'')+TCC_1(k',k'')z+TCC_2(k',k'')z^2$$ (Eq. 7).

This is possible because $TCC_a(k', k'', z)$ represents the incoherent sum, which is a slow varying function of z and does not include standing waves. b(k', k'', z) can be expanded into a Taylor series, e.g., to the zero-th order of k' and k'', $$b(k',k'',z)\approx b(0,0,z)=$$ (Eq. 8)

$$\frac{TCC_{+-}(0,0,z)\cos(2\beta z)+TCC_{-+}(0,0,z)\sin(2\beta z)}{TCC_{++}(0,0,z)+TCC_{--}(0,0,z)},$$

which is a function of only z. To clarify, b(0, 0, z) is referred to as b(z) hereafter. b(z) is independent from the directions of propagation of the forward propagating radiation and the backward propagating radiation. Preferably, b(z) is independent from a mask in the lithographic projection apparatus.

By plugging Eq. 7 and Eq. 8 into Eq. 6, $$TCC(k',k'',z)\approx[TCC_0(k',k'')+TCC_1(k',k'')z+TCC_2(k',k'')z^2][1+b(z)]$$ (Eq. 9).

By plugging Eq. 9 into Eq. 2, the three-dimensional spatial intensity distribution of radiation in the resist layer can be approximated as, $$[I_0(x,y)+I_1(x,y)z+I_2(x,y)z^2][1+b(z)]$$ (Eq. 10), wherein $I_0(x,y)=\Sigma_k\Sigma_{k''}TCC_0(k',k'')M(k')M^*(k'')\exp(-j(k'-k'')r)$, $$I_1(x,y)=\Sigma_k\Sigma_{k''}TCC_1(k',k'')M(k')M^*(k'')\exp(-j(k'-k'')r)$$

$$I_2(x,y)=\Sigma_k\Sigma_{k''}TCC_2(k',k'')M(k')M^*(k'')\exp(-j(k'-k'')r)$$

In an embodiment, $TCC_0(k', k'')$, $TCC_1(k', k'')$, and $TCC_2(k', k'')$ can be calculated from TCCs rigorously calculated at three z locations: $z_1$, $z_2$ and $z_3$:

$$\begin{bmatrix} 1 & z_1 & z_1^2 \\ 1 & z_2 & z_2^2 \\ 1 & z_3 & z_3^2 \end{bmatrix} \begin{bmatrix} TCC_0(k',k'') \\ TCC_1(k',k'') \\ TCC_2(k',k'') \end{bmatrix} = \begin{bmatrix} TCC(k',k'',z_1)/(1+b(z_1)) \\ TCC(k',k'',z_2)/(1+b(z_2)) \\ TCC(k',k'',z_3)/(1+b(z_3)) \end{bmatrix}.$$

Figure 6:
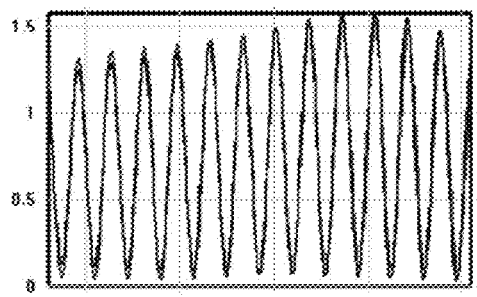
FIG. 6 shows that cross-sections through exemplary three-dimensional spatial intensity distributions of radiation in the resist layer calculated using a rigorous method and the method in FIG. 4, respectively.
Figure 6:
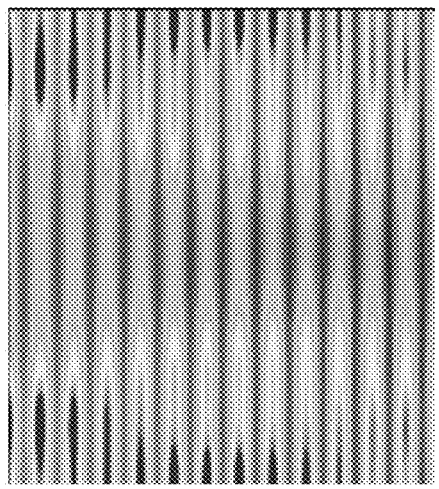
Figure 6:
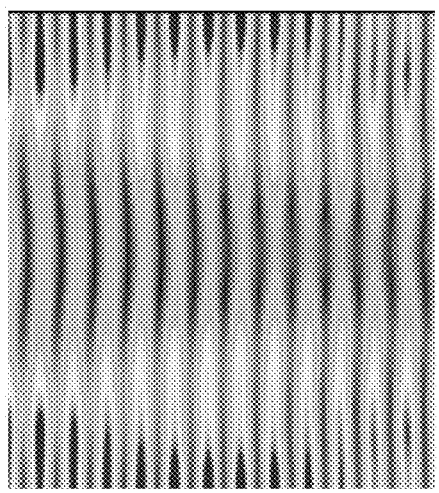

FIG. 6 shows that cross-sections through exemplary three-dimensional spatial intensity distributions of radiation in the resist layer calculated using a rigorous method and the method in FIG. 4, respectively. The left panel of FIG. 6 is a cross-section through a three-dimensional spatial intensity distribution of radiation computed using a rigorous method. The middle panel of FIG. 6 is a cross-section through a three-dimensional spatial intensity distribution of radiation computed using the method of FIG. 4. The right panel of FIG. 6 is a line profile through the middle of the cross-sections in the left and middle panels. As one can be plainly see, the method in FIG. 4 nearly is as good as the rigorous method but is much less computationally costly. The filmstack used in this example comprises a resist layer (0.9 micron thick, ñ=1.77+0.008i) exposed in ambient (ñ=1), a film (0.275 micron thick, ñ=1.56) under the resist layer, and the substrate (ñ=1.57+3.565i).

In one embodiment, the three-dimensional resist image can be estimated from the three-dimensional spatial intensity distribution by applying a blur such as Gaussian blur and applying a threshold. Of course, the resist image can be estimated using any other suitable methods. This estimation process (e.g., parameters in the Gaussian blur) depends on the characteristics of the resist and any post-exposure processing such as developing and baking.

In one embodiment, the three-dimensional resist image can be derived from the three-dimensional spatial intensity distribution by using a suitable resist model. In one example, the resist model comprises calculating a three-dimensional spatial concentration of acid in the resist layer. In some resists, the three-dimensional spatial concentration of acid in the resist layer is a linear function of the three-dimensional spatial intensity distribution. From the three-dimensional spatial concentration of acid, effects of post-exposure bake (including acid inhibitor reaction, acid base neutralization, and three-dimensional diffusion of various chemical species) and development can be calculated to arrive at the three-dimensional resist image.

Three-dimensional diffusion such as three-dimensional diffusion of a chemical species can be rigorously modeled by a three-dimensional diffusion equation. When the diffusion coefficient is a constant, which is a sound assumption for most resists, three-dimensional diffusion of a chemical species can modeled by three one-dimensional diffusion equations in x, y, and z directions separately. Various existing methods can model two-dimensional diffusion in the x-y plane and be used to calculate two-dimensional concentration distribution of the chemical species at one or more planes in the resist layer. One such method can be found in commonly assigned U.S. Pat. No. 7,003,758, which is incorporated by reference in its entirety. See also "Optimized Hardware and Software for Fast, Full Chip Simulation," Y. Cao et al., Proc. SPIE Vol. 5754, 407 (2005).

In one embodiment, three-dimensional diffusion such as three-dimensional diffusion of a chemical species in the resist layer can be calculated from two-dimensional distribution such as two-dimensional concentration distribution of the chemical species at one or more planes in the resist layer. Under the boundary condition that there is no loss (e.g., of the chemical species) through boundaries such as the top and bottom of the resist layer, the solution to a diffusion equation in the z direction is:

$$H(x, y, z, t) = \sum_l a_l(x, y, t) \cos\left(\frac{\pi l}{L_z}z\right) e^{-D_H\left(\frac{\pi l}{L_z}\right)^2 t},$$

where $H(x, y, z, t)$ is the three-dimensional distribution such as three-dimensional concentration distribution of the chemical species, $a_l$ is Fourier cosine transform of $H(x, y, z, t)$ in the z direction, $L_z$ is the thickness of the resist layer, $D_H$ is the diffusion coefficient. Other boundary condition is also possible. $a_l$ can be calculated from an initial condition of the two-dimensional distribution, such as two-dimensional concentration distribution of the chemical species at one or more planes in the resist layer, which may be calculated from the three-dimensional spatial intensity distribution. Alternatively, the initial condition of two-dimensional concentration distribution of the chemical species at one or more planes in the resist layer by existing methods that model two-dimensional diffusion in the x-y plane.

In one embodiment, $H(x, y, z, t)$ may be calculated using a convolution between $$H_{xy}(z) = \sum_l a_l(x, y, t) \cos\left(\frac{\pi l}{L_z}z\right) \text{ and } G(z) = \frac{1}{\sqrt{2\pi\sigma^2}} e^{-\frac{z^2}{2\sigma^2}},$$

where $\sigma = \sqrt{2D_H t}$.

Namely, $H(x, y, z, t) = H_{xy}(z) \otimes G(z)$. $a_l$ can be calculated from an initial condition of two-dimensional concentration distribution of the chemical species at one or more planes in the resist layer, which may be calculated from the three-dimensional spatial intensity distribution. Alternatively, the initial condition of two-dimensional concentration distribution of the chemical species at one or more planes in the resist layer by existing methods that model two-dimensional diffusion in the x-y plane. The convolution can be further simplified as a weighted sum of discrete sample points in the z direction with pre-determined weighting factors. For linear resist models where concentration distribution of the chemical species is a linear function of the three-dimensional spatial intensity distribution, three sample points are sufficient.

Figure 7:
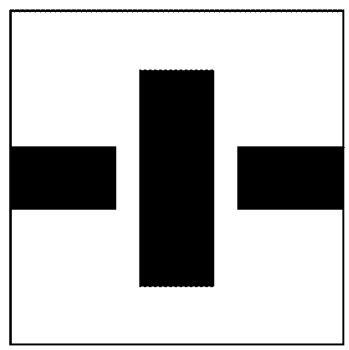
FIG. 7 shows exemplary concentration distributions of inhibitor calculated from densely sampled points and from sparsely sampled points at three different x-y planes.
Figure 7:
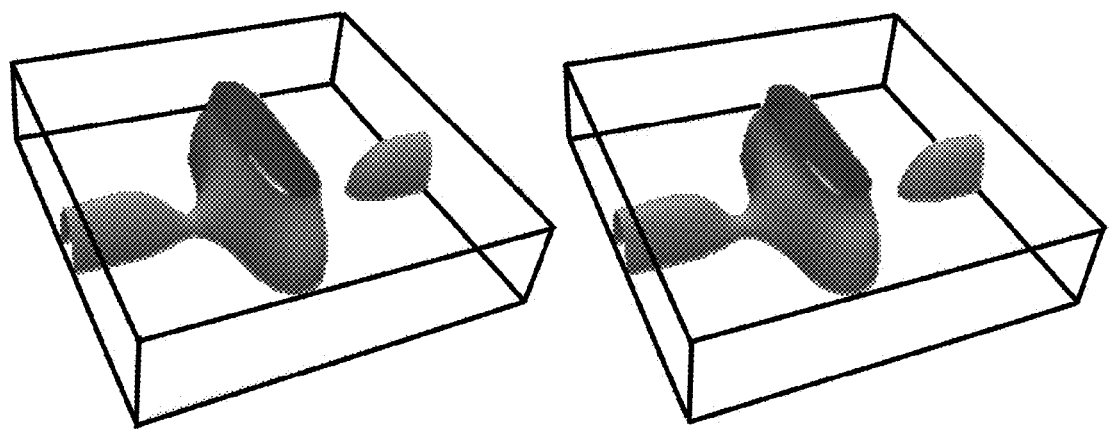

FIG. 7 shows exemplary concentration distributions of inhibitor calculated from densely sampled points with interval of dx=dy=dz=2 nm (lower left panel) and from sparsely sampled points with interval of dx=dy=10 mm (lower right panel) at three different x-y planes. The mask pattern based on which the concentration distributions of inhibitor are calculated is depicted in the upper panel. The close similarity of these distributions demonstrates that sparse sampling is a good approximation. The three-dimensional resist image can be obtained by taking a threshold on the concentration distributions of the inhibitor.

The methods of calculating three-dimensional diffusion from an initial condition of a two-dimensional distribution is not limited to diffusion of chemical species in the resist layer.

Figure 8:
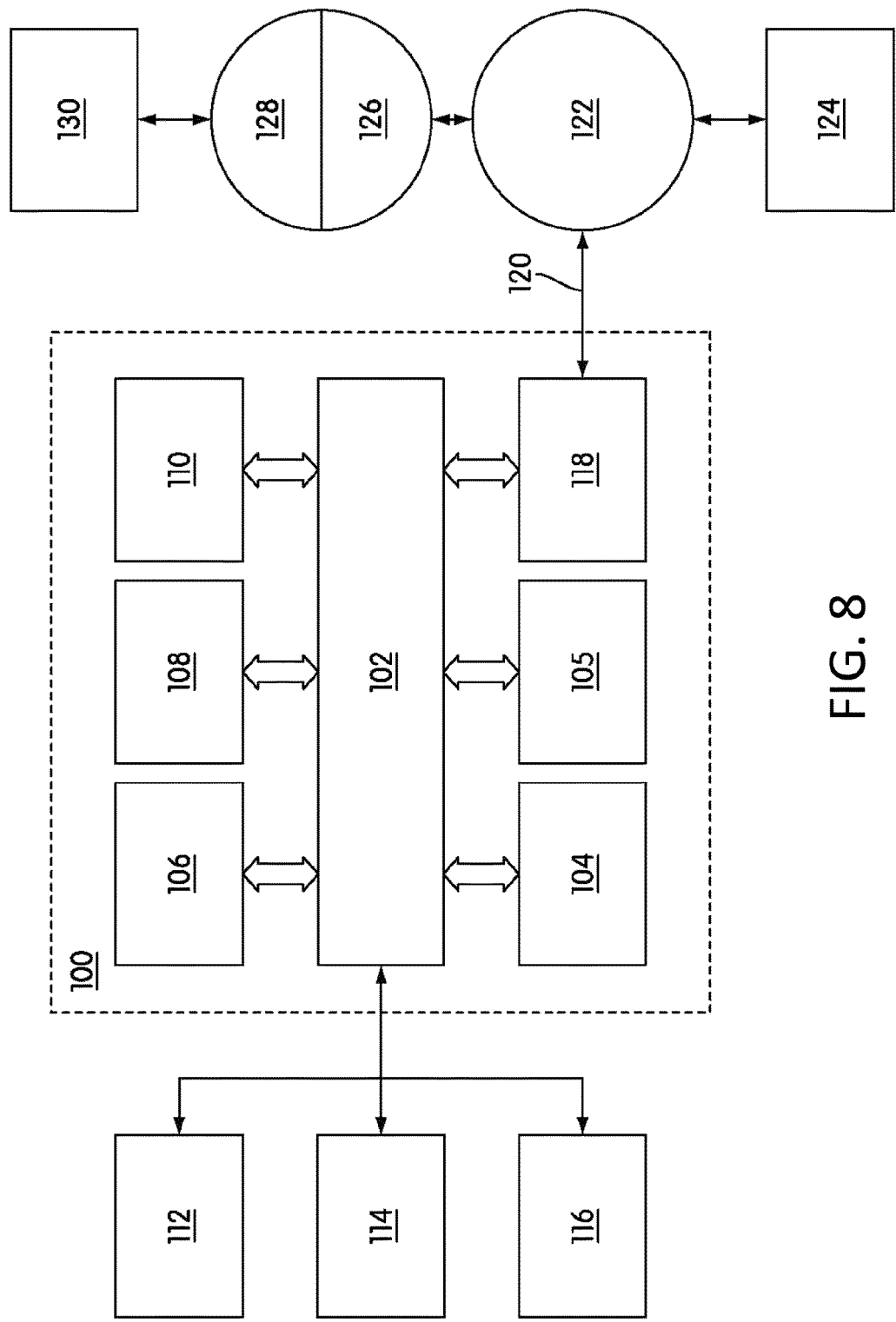
FIG. 8 is a block diagram of an example computer system in which embodiments can be implemented.

FIG. 8 is an exemplary block diagram that illustrates a computer system 100 which can assist in embodying and/or implementing the pattern selection method disclosed herein. Computer system 100 includes a bus 102 or other communication mechanism for communicating information, and one or more processor(s) 104 (and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the simulation process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions. Thus, embodiments are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with an embodiment, one such downloaded application provides for the test pattern selection of the embodiment, for example. The received code may be executed by processor 104 as it is received, and/or stored in storage device 110, or other non-volatile storage for later execution. In this manner, computer system 100 may obtain application code in the form of a carrier wave.

Figure 9:
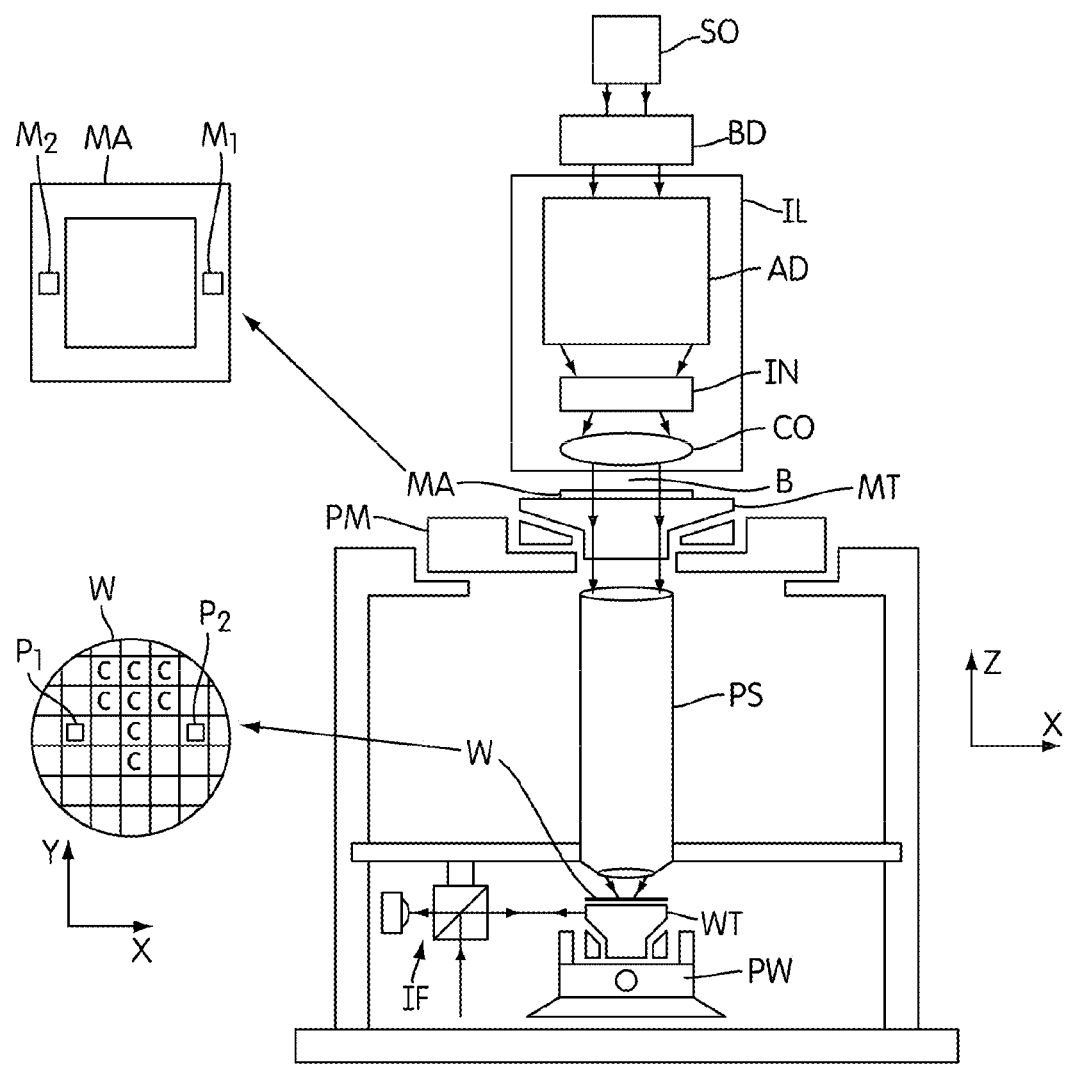
FIG. 9 is a schematic diagram of a lithographic projection apparatus to which embodiments are applicable.

FIG. 9 schematically depicts an exemplary lithographic projection apparatus whose performance could be simulated and/or optimized utilizing the computational lithography models that are calibrated using the test pattern selection process of present invention. The apparatus comprises:

a radiation system IL, for supplying a projection beam B of radiation. In this particular case, the radiation system also comprises a radiation source SO;

a first object table (mask table) MT provided with a mask holder for holding a mask MA (e.g., a reticle), and connected to first positioning means PM for accurately positioning the mask with respect to projection system PS;

a second object table (substrate table) WT provided with a substrate holder for holding a substrate W (e.g., a resist coated silicon wafer), and connected to second positioning means PW for accurately positioning the substrate with respect to projection system PS;

a projection system ("lens") PS (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source SO (e.g., a mercury lamp or excimer laser) produces a beam of radiation. This beam is fed into an illumination system (illuminator) IL, either directly or after having traversed conditioning means, such as a beam expander or beam delivery system BD, for example. The illuminator IL may comprise adjusting means AD for setting the outer and/ or inner radial extent (commonly referred to as σ-outer and σ-inner, respectively) of the intensity distribution in the beam. In addition, it will generally comprise various other components, such as an integrator IN and a condenser CO. In this way, the beam B impinging on the mask MA has a desired uniformity and intensity distribution in its cross section.

It should be noted with regard to FIG. 9 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or F2 lasing). The current invention encompasses at least both of these scenarios.

The beam B subsequently intercepts the mask MA, which is held on a mask table MT. Having traversed the mask MA, the beam B passes through the lens PS, which focuses the beam PS onto a target portion C of the substrate W. With the aid of the second positioning means (and interferometric measuring means IF), the substrate table WT can be moved accurately, e.g. so as to position different target portions C in the path of the beam B. Similarly, the first positioning means can be used to accurately position the mask MA with respect to the path of the beam B, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 9. However, in the case of a wafer stepper (as opposed to a step-and-scan tool) the mask table MT may just be connected to a short stroke actuator, or may be fixed.

Patterning device MA and substrate W may be aligned using alignment marks M1, M2 in the patterning device, and alignment marks P1, P2 on the wafer, as required.

The depicted tool can be used in two different modes:

In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam B;

In scan mode, essentially the same scenario applies, except that a given target portion C is not exposed in a single "flash". Instead, the mask table MT is movable in a given direction (the so called "scan direction", e.g., the y direction) with a speed v, so that the projection beam B is caused to scan over a mask image; concurrently, the substrate table WT is simultaneously moved in the same or opposite direction at a speed V=Mv, in which M is the magnification of the lens PS (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include DW (deep ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Although the present invention has been particularly described with reference to the preferred embodiments thereof, it should be readily apparent to those of ordinary skill in the art that changes and modifications in the form and details may be made without departing from the spirit and scope. It is intended that the appended claims encompass such changes and modification. The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The invention may further be described using the following clauses:

1. A method for simulating a three-dimensional spatial intensity distribution of radiation formed within a resist layer on a substrate resulting from an incident radiation, the method comprising:

calculating an incoherent sum of forward propagating radiation in the resist layer and backward propagating radiation in the resist layer;

calculating an interference of the forward propagating radiation in the resist layer and the backward propagating radiation in the resist layer; and calculating the three-dimensional spatial intensity distribution of radiation from the incoherent sum and the interference.

2. The method of clause 1, wherein the incoherent sum is free of standing wave.

3. The method of clause 1, further comprising calculating the interference multiplying the incoherent sum and an interference factor, wherein the interference factor is a function of a depth into the resist layer.

4. The method of any one of clauses 1-3, wherein the interference factor is independent from directions of propagation of the forward propagating radiation and the backward propagating radiation.

5. The method of any one of clauses 1-4, wherein the forward propagating radiation and the backward propagating radiation substantially form a standing wave.

6. The method of any one of clauses 1-5, further comprising approximating the incoherent sum by expanding the incoherent sum into a Taylor series of a depth into the resist layer.

7. The method of clause 6, wherein the incoherent sum is expanded into the Taylor series to a quadratic term of the depth into the resist layer.

8. The method of any one of clauses 1-7, wherein calculating the incoherent sum comprises calculating a transmission cross coefficient (TCC).

9. The method of any one of clauses 1-7, wherein calculating the incoherent sum comprises calculating three transmission cross coefficients at at least three different depths into the resist layer.

10. The method any one of clauses 1-9, further comprising computing a three-dimensional resist image formed within the resist layer from the three-dimensional spatial intensity distribution of radiation.

11. The method of clause 10, wherein computing a three-dimensional resist image comprises applying a blur and a threshold to the three-dimensional spatial intensity distribution of radiation.

12. The method of clause 10, wherein computing a three-dimensional resist image comprises using a resist model.

13. The method of clause 12, wherein the resist model comprises calculating a three-dimensional spatial concentration of acid in the resist layer from the three-dimensional spatial intensity distribution of radiation.

14. The method of clause 10, wherein computing a three-dimensional resist image comprises calculating a three-dimensional concentration of a chemical species.

15. The method of clause 14, wherein calculating the three-dimensional concentration distribution of the chemical species comprising a diffusion of the chemical species from two-dimensional concentration distribution of the chemical species at one or more planes in the resist layer.

16. The method of clause 14, wherein calculating the three-dimensional concentration distribution of the chemical species comprising calculating a diffusion of the chemical species under a boundary condition that there is no loss of the chemical species through a top and a bottom of the resist layer.

17. The method of clause 14, calculating the three-dimensional concentration distribution of the chemical species comprising calculating a diffusion of the chemical species under an initial condition of two-dimensional concentration distribution of the chemical species at one or more planes in the resist layer.

18. The method of clause 14, wherein calculating the three-dimensional concentration distribution of the chemical species comprising calculating a Fourier transform of the three-dimensional concentration distribution of the chemical species.

19. The method of clause 14, wherein calculating the three-dimensional concentration distribution of the chemical species comprising calculating a convolution.

20. The method of any one of clauses 1-19, wherein the substrate has features in or underlying the resist layer.

21. The method of any one of clauses 1-20, wherein the incident radiation has a wavelength in the extreme ultraviolet band.

22. The method of any one of clauses 1-21, wherein the substrate is free of an anti-reflective coating.

23. The method of clause 8, wherein the TCC is calculated from a projection optics function.

24. The method of clause 23, wherein the projection optics function is a function of distortions of the incident radiation caused by the resist layer.

25. The method of any one of clauses 1-3, wherein the interference factor is independent from a mask in the lithographic projection apparatus 26. A computer program product comprising a computer readable medium having instructions recorded thereon, the instructions when executed by a computer implementing the method of any of the above clauses.

The descriptions above are intended to be illustrative, not limiting. Thus, it will be apparent to one skilled in the art that modifications may be made to the embodiments as described without departing from the scope of the claims set out below.

What is claimed is:

1. A method for simulating a three-dimensional spatial intensity distribution of radiation formed within a resist layer on a substrate resulting from an incident radiation, the method comprising:

determining, using a computer system, an incoherent sum of forward propagating radiation in the resist layer and backward propagating radiation in the resist layer;

determining, using the computer system, an interference of the forward propagating radiation in the resist layer and the backward propagating radiation in the resist layer; and determining, using the computer system, the three-dimensional spatial intensity distribution of radiation from the incoherent sum and the interference.

2. The method of claim 1, wherein the incoherent sum is free of a standing wave.

3. The method of claim 1, further comprising determining the interference by multiplying the incoherent sum and an interference factor, wherein the interference factor is a function of a depth into the resist layer.

4. The method of claim 3, wherein the interference factor is independent from a mask used in the lithographic projection apparatus to pattern the incident radiation.

5. The method of claim 1, wherein the interference factor is independent from directions of propagation of the forward propagating radiation and the backward propagating radiation.

6. The method of claim 1, wherein the forward propagating radiation and the backward propagating radiation form a standing wave.

7. The method of claim 1, further comprising approximating the incoherent sum by expanding the incoherent sum into a plurality of terms of a Taylor series of a depth into the resist layer.

8. The method of claim 7, wherein the incoherent sum is expanded to a quadratic term of the Taylor series of the depth into the resist layer.

9. The method of claim 1, wherein determining the incoherent sum comprises calculating a transmission cross coefficient (TCC).

10. The method of claim 9, wherein the TCC is calculated from a projection optics function.

11. The method of claim 10, wherein the projection optics function is a function of distortions of the incident radiation caused by the resist layer.

12. The method of claim 1, wherein determining the incoherent sum comprises calculating three transmission cross coefficients at at least three different depths into the resist layer.

13. The method of claim 1, further comprising computing a three-dimensional resist image formed within the resist layer from the three-dimensional spatial intensity distribution of radiation.

14. The method of claim 13, wherein computing a three-dimensional resist image comprises applying a blur and a threshold to the three-dimensional spatial intensity distribution of radiation and/or wherein computing a three-dimensional resist image comprises using a resist model.

15. The method of claim 14, wherein the resist model comprises calculating a three-dimensional spatial concentration of acid in the resist layer from the three-dimensional spatial intensity distribution of radiation.

16. The method of claim 13, wherein computing a three-dimensional resist image comprises calculating a three-dimensional concentration distribution of a chemical species.

17. The method of claim 16, wherein calculating the three-dimensional concentration distribution of the chemical species comprising comprises determining a diffusion of the chemical species from a two-dimensional concentration distribution of the chemical species at one or more planes in the resist layer.

18. The method of claim 1, wherein the substrate has features in or underlying the resist layer.

19. The method of claim 1, wherein the substrate is free of an anti-reflective coating.

20. A computer program product comprising a non-transitory computer readable medium having instructions recorded thereon, the instructions when executed by a computer implementing the method of claim 1.

21. The method of claim 1, comprising:
producing a lithographic mask layout that compensates for a patterning defect indicated by the determined three-dimensional spatial intensity distribution of radiation.

* * * * *